US 10,830,611 B2

(12) United States Patent
Nishimoto et al.

(10) Patent No.: US 10,830,611 B2
(45) Date of Patent: Nov. 10, 2020

(54) MAGNETIC FIELD DETECTION DEVICE

(71) Applicant: DENSO CORPORATION, Kariya (JP)

(72) Inventors: Seiji Nishimoto, Kariya (JP);
Tomoyuki Takiguchi, Kariya (JP);
Yoshiyuki Kono, Kariya (JP); Akitoshi Mizutani, Kariya (JP)

(73) Assignee: DENSO CORPORATION, Kariya (JP)

( * ) Notice: Subject to any disclaimer, the term of this patent is extended or adjusted under 35 U.S.C. 154(b) by 139 days.

(21) Appl. No.: 15/755,234

(22) PCT Filed: Aug. 8, 2016

(86) PCT No.: PCT/JP2016/073241
§ 371 (c)(1),
(2) Date: Feb. 26, 2018

(87) PCT Pub. No.: WO2017/038388
PCT Pub. Date: Mar. 9, 2017

(65) Prior Publication Data
US 2018/0245953 A1     Aug. 30, 2018

(30) Foreign Application Priority Data

Aug. 28, 2015    (JP) .................................. 2015-168767
Jun. 13, 2016    (JP) .................................. 2016-116888

(51) Int. Cl.
*G01D 5/14*      (2006.01)
*G01R 33/02*    (2006.01)
(Continued)

(52) U.S. Cl.
CPC ............... *G01D 5/145* (2013.01); *G01D 5/14* (2013.01); *G01D 11/245* (2013.01); *G01R 33/02* (2013.01);
(Continued)

(58) Field of Classification Search
CPC ........ G01D 5/145; G01D 11/245; G01D 5/14; G01R 33/02; H01L 23/3107; H01L 23/3135
See application file for complete search history.

(56) References Cited

U.S. PATENT DOCUMENTS 5,637,995 A    6/1997   Izawa et al.
9,944,002 B2*   4/2018   Takiguchi .............. G01D 5/145
(Continued)

FOREIGN PATENT DOCUMENTS

JP         2006-329922      12/2006

*Primary Examiner* — Amy He
(74) *Attorney, Agent, or Firm* — Nixon & Vanderhye P.C.

(57) ABSTRACT

A magnetic field detection device includes an IC package, a terminal, a resin mold member. The IC package includes a magnetism detection element, a lead frame located on a first side of the magnetism detection element, and a resin member covering the magnetism detection element and the lead frame. The resin mold member includes a base portion and a head portion. The head portion includes a thickest portion. An outer wall surface of the thickest portion located on a second side of the magnetism detection element is a detection reference surface. An element corresponding surface that is an outer wall surface of the IC package located on the second side is exposed to an outside of resin mold member or covered with a detection side thin portion thinner than a thickness from the element corresponding surface to the detection side reference surface.

1 Claim, 11 Drawing Sheets

(51) Int. Cl.
*H01L 23/31* (2006.01)
*G01D 11/24* (2006.01)
(52) U.S. Cl.
CPC ...... *H01L 23/3107* (2013.01); *H01L 23/3135* (2013.01)

(56) References Cited

U.S. PATENT DOCUMENTS

| | | |
|---|---|---|
| 2005/0275399 A1* | 12/2005 | Kitanaka ................ G01D 5/145 324/207.12 |
| 2006/0066296 A1 | 3/2006 | Kuroyanagi et al. |
| 2012/0268111 A1 | 10/2012 | Hiramoto et al. |
| 2012/0297920 A1 | 11/2012 | Saito et al. |
| 2015/0061657 A1 | 3/2015 | Takiguchi et al. |

* cited by examiner

MAGNETIC FIELD DETECTION DEVICE

CROSS REFERENCE TO RELATED APPLICATION

This application is the U.S. national phase of International Application No. PCT/2016/073241, filed Aug. 8, 2016 and claims priority to Japanese Patent Applications No. 2015-168767 filed on Aug. 28, 2015, and No. 2016-116888 filed on Jun. 13, 2016, the entire contents of each of which are hereby incorporated by reference.

TECHNICAL FIELD

The present disclosure relates to a magnetic field detection device.

BACKGROUND ART

Conventionally, a magnetic field detection device that outputs a signal corresponding to a direction of a magnetic field is known.

A magnetic field detection device disclosed in Patent Document 1 is used as a rotation angle sensor that detects a rotation angle of a throttle valve of an electronic control throttle controlling the amount of air drawn to an engine. A housing cover of the electronic control throttle, two poles extending from the housing cover, and two IC packages inserted between the two poles are integrally molded by a resin member to form the magnetic field detection device.

PRIOR ART DOCUMENT

Patent Document

Patent Document 1: JP 5517083

SUMMARY OF THE INVENTION

Patent Document 1 discloses that an UV-curing resin or a hot-melt adhesive heated and melted is injected to a die in which the IC package is fixed. However, a difference of the linear expansions between the injected resin material and the IC package may cause a stress exerted on a magnetism detection element in the IC package when the temperature changes, and accordingly an error of an output signal may occur. Consequently, accuracy in detecting a rotation angle of a throttle valve by the magnetism detection device may decrease.

In consideration of the above-described points, it is an objective of the present disclosure to limit a stress caused by a difference of linear expansions due to temperature change to provide a magnetism detection device capable of achieving a high detection accuracy.

A magnetic field detection device according to a first aspect of the present disclosure includes an IC package, a terminal, a resin mold member. The IC package includes: a magnetism detection element outputting a signal corresponding to a direction of a magnetic field; a lead frame located on a first side of the magnetism detection element, the lead frame being connected to the magnetism detection element; and a resin member covering the magnetism detection element and the lead frame. The terminal is connected to a part of the lead frame of the IC package, the part of the lead frame protruding from the resin member. The resin mold member includes a base portion and a head portion, and covers the IC package and a part of the terminal. The base portion covers a connection part in which the lead frame is connected to the terminal. The head portion protrudes from the base portion in a direction away from the terminal and covers a part of the IC package, the part of the IC package including the magnetism detection element. The head portion includes a thickest portion in which a thickness from a surface of the IC package is largest in the head portion. An outer wall surface of the thickest portion located on a second side of the magnetism detection element opposite from the first side is defined as a detection side reference surface. An element corresponding surface that is an outer wall surface of the IC package located on the second side is exposed to an outside of the resin mold member or covered with a detection side thin portion of the resin mold member that has a thickness smaller than a thickness from the element corresponding surface to the detection side reference surface.

According to this, since a stress caused by a difference of linear expansions due to temperature change and exerted by the resin mold member on the element corresponding surface of the IC package can be limited, an error of an output signal of the magnetism detection element can be limited. Moreover, since the IC package and a part of the terminal are covered with the resin mold member, positions of those are fixed, and accordingly accuracy in detection by the magnetism detection device can be improved.

The resin mold member does not cover the element corresponding surface. That is, when the element corresponding surface is exposed to an outside of the resin mold member, the resin mold member can be formed by injection molding in a condition where an inner wall of a die for molding the resin mold member is in contact with the element corresponding surface. Therefore, accuracy in positioning of the IC package is improved, and accordingly accuracy in detection by the magnetism detection device can be improved.

In contrast, when the element corresponding surface is covered with the detection side thin portion of the resin mold member, the resin mold member is formed by injection molding in a condition where the inner wall of the die for molding the resin mold member is out of contact with the element corresponding surface. According to this, a required precision of the die can be reduced.

EMBODIMENTS FOR EXPLOITATION OF THE INVENTION

Figure 1:
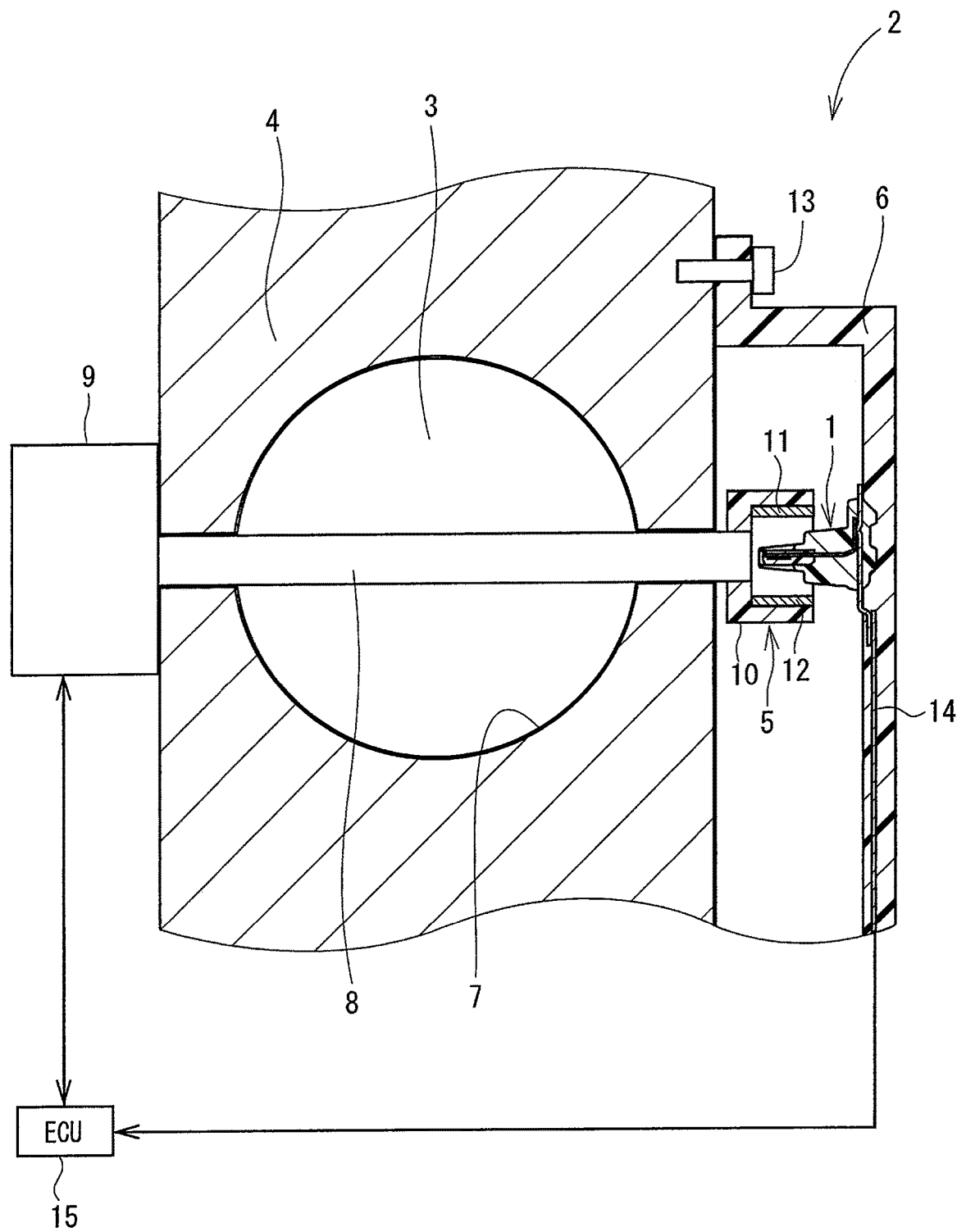
FIG. 1 is a cross-sectional diagram illustrating an electronic control throttle in which a magnetic field detection device is used, according to a first embodiment of the present disclosure.
Figure 2:
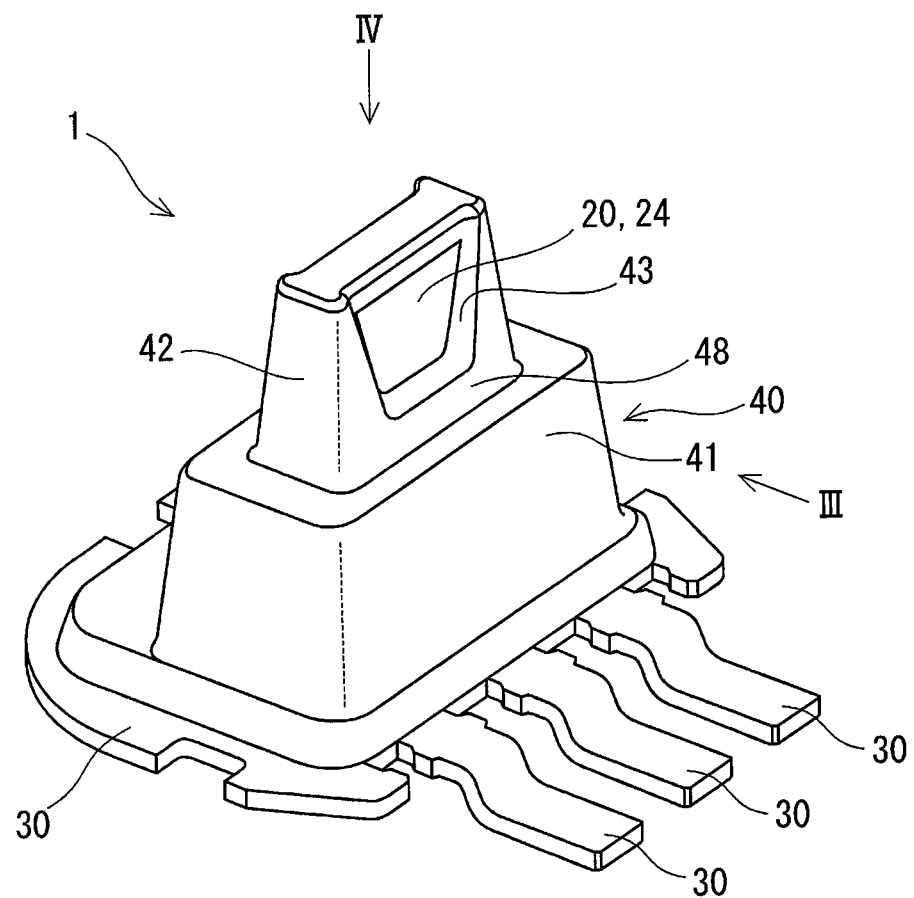
FIG. 2 is a perspective view illustrating the magnetic field detection device according to the first embodiment.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereinafter, multiple embodiments of the present disclosure will be described with reference to the drawings.

First Embodiment

A first embodiment of the present disclosure is shown in FIGS. 1 through 6. A magnetic field detection device 1 according to the first embodiment is used in an electronic control throttle 2 that controls the amount of air drawn to an engine of a vehicle, for example. The magnetic field detection device 1 outputs a signal corresponding to a rotation angle of a throttle valve 3 that is a detection target included in the electronic control throttle 2.

First, a general structure of the electronic control device 2 will be described.

As shown in FIG. 1, the electronic control device 2 includes a throttle valve 3, a housing 4, a magnetic field generation portion 5, a housing cover 6, and the magnetic field detection device 1, for example.

An air intake passage 7 through which an air is introduced into the engine is defined in the housing 4. The throttle valve 3 that has an approximately disc shape is provided in the air intake passage 7. The throttle valve 3 is fixed to a valve shaft 8. Both ends of the valve shaft 8 is rotatably supported by the housing 4. According to this, the throttle valve 3 is capable of rotating about a center of the valve shaft 8.

A motor 9 is attached to one end of the valve shaft 8. The motor 9 is controlled by an instruction of an electronic control unit (ECU) 15 of the engine. The motor 9 is driven to control an opening degree of the throttle valve 3, and accordingly the amount of an intake air supplied to the engine is adjusted.

A holder 10 that has a bottomed cylinder shape is provided on the other end of the valve shaft 8. Two magnets 11, 12 that constitute the magnetic field generation portion 5, and two yokes that are not shown and connect the two magnets 11, 12 to each other in a circumferential direction are provided on a radially inner wall of the holder 10. The two magnets 11, 12 are arranged to face each other in a radial direction of the rotation axis of the throttle valve 3, and the two magnets 11, 12 apply a magnetic flux of a north pole to one yoke, and a magnetic flux of a south pole to the other yoke. According to this, since the magnetic flux flows from the one yoke to the other yoke in the holder 10, a magnetic field is generated in which the magnetic flux flows in a direction perpendicular to the rotation axis of the throttle valve 3. The direction of the magnetic field in the holder 10 changes according to the rotation of the throttle valve 3.

The housing cover 6 is attached, by a screw 13, to a side of the housing 4 facing the magnetic field generation portion 5.

The housing cover 6 is made of resin and has a dish shape. A wire 14 is fixed to the housing cover 6.

The magnetic field detection device 1 is fixed to the housing cover 6, and a part of the magnetic field detection device 1 is inserted into a radially inner side of the holder 10. As shown in FIGS. 2 to 5, an IC package 20 and a terminal 30 are molded (covered) with a resin mold member 40 to form the magnetic field detection device 1.

The IC package 20 outputs a voltage signal corresponding to the direction of the magnetic field generated by the magnetic field generation portion 5. The terminal 30 electrically connects the IC package 20 with the above-described wire 14 of the housing cover 6. The resin mold member 40 fixes the IC package 20 and a part of the terminal 30 by a resin mold, and limits a change of positions of the IC package 20 and the terminal 30.

The signal output from the IC package 20 is transmitted from the terminal 30 to an ECU 15 through the wire 14 of the housing cover 6. The ECU 15 controls parts of a vehicle.

Next, the IC package 20, the terminal 30, and the resin mold member 40 which constitute the magnetic field detection device 1 of the first embodiment will be described with reference to FIGS. 2 to 6.

In the IC package 20, a magnetism detection element 21 (see FIG. 5) and a lead frame 22 are covered with a resin member 23.

Figure 6:
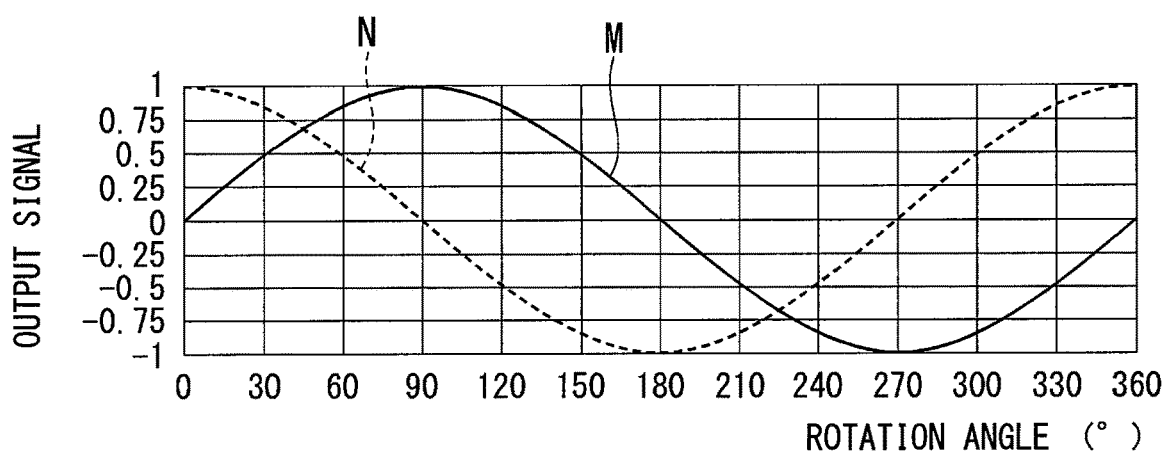
FIG. 6 is a characteristics diagram illustrating a signal output from the magnetic field detection device according to the first embodiment.

The magnetism detection element 21 is a semiconductor integrated circuit in which a first magnetism detection portion and a second magnetism detection portion are provided. The first magnetism detection portion and the second magnetism detection portion are provided in a part of the semiconductor integrated circuit and not shown in the drawings. The first magnetism detection portion outputs a voltage signal corresponding to a magnetic flux density passing through a magnetism detection surface of the first magnetism detection portion. The second magnetism detection portion outputs a voltage signal corresponding to a magnetic flux density passing through a magnetism detection surface of the second magnetism detection portion. In the semiconductor integrated circuit, the magnetism detection surfaces of the first magnetism detection portion and the second magnetism detection portion are perpendicular to each other. Accordingly, as shown in FIG. 6, the first magnetism detection portion and the second magnetism detection portion output, based on a predetermined direction of the magnetic field, signals whose phase angles are different by 90 degrees from each other. The signals form sine wave and a cosine wave.

In FIG. 6, the horizontal line represents a rotation angle, and the vertical line represents the output signal when the amplitude of the sine wave and the cosine wave is 1. In FIG. 6, the output signal of the first magnetism detection portion is indicated by a solid line M, and the output signal of the second magnetism detection portion is indicated by a dashed line N.

A calculation portion of the IC package 20 uses the signal output by the first magnetism detection portion as a sine wave signal and uses the signal output by the second magnetism detection portion as a cosine wave signal to perform an arctangent operation, for example, and the calculation portion outputs a linear signal corresponding to the rotation angle of the throttle valve 3. Consequently, the magnetic field detection device 1 is capable of detecting the rotation angle of the throttle valve 3 accurately. In another embodiment, the arctangent operation may be performed by the ECU 15.

Figure 3:
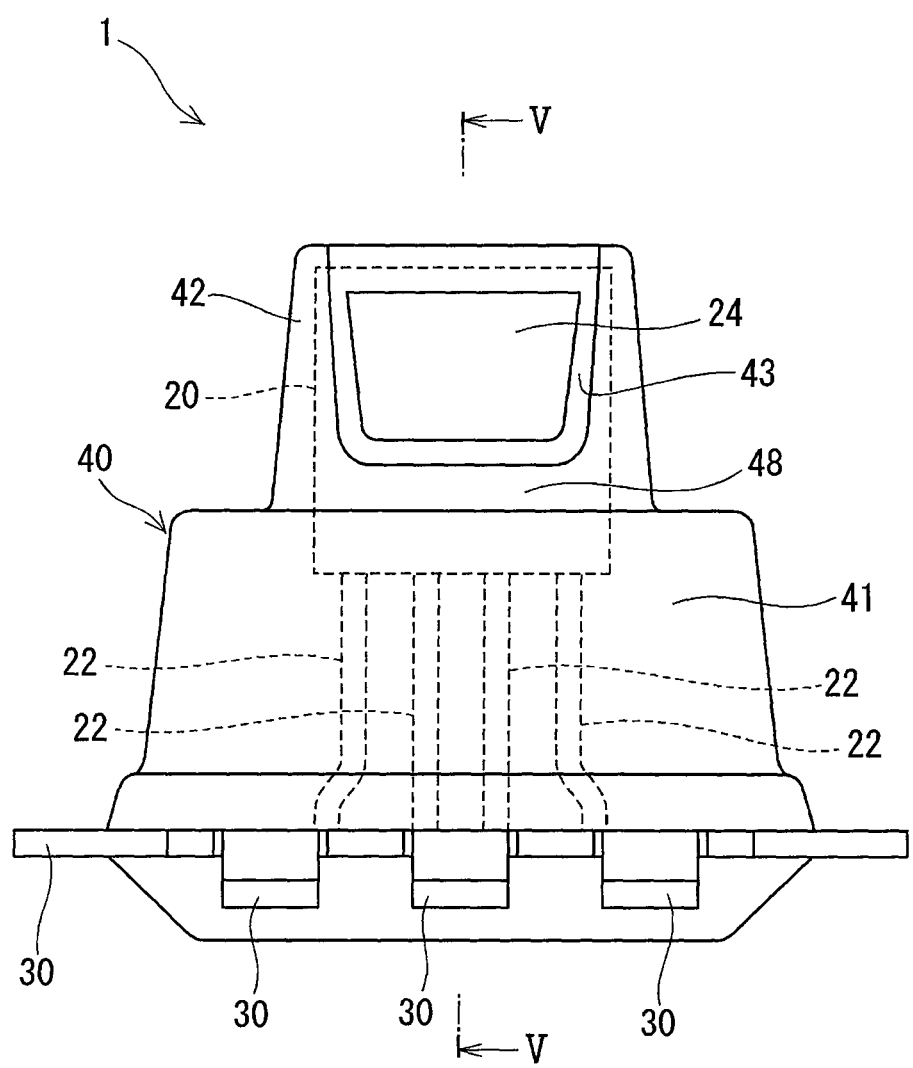
FIG. 3 is a front view in III direction of FIG. 2 illustrating the magnetic field detection device.
Figure 4:
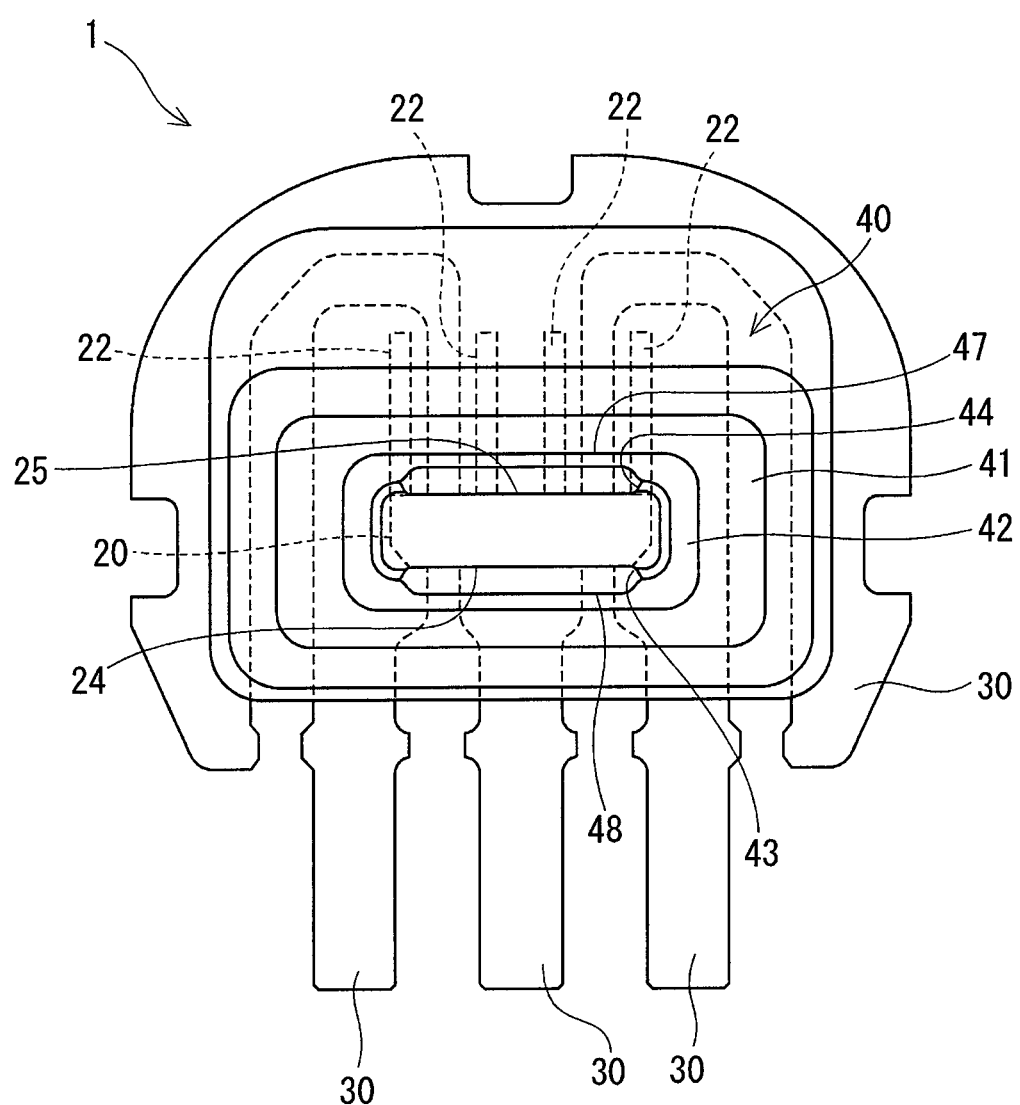
FIG. 4 is a plan view in IV direction of FIG. 2 illustrating the magnetic field detection device.
Figure 5:
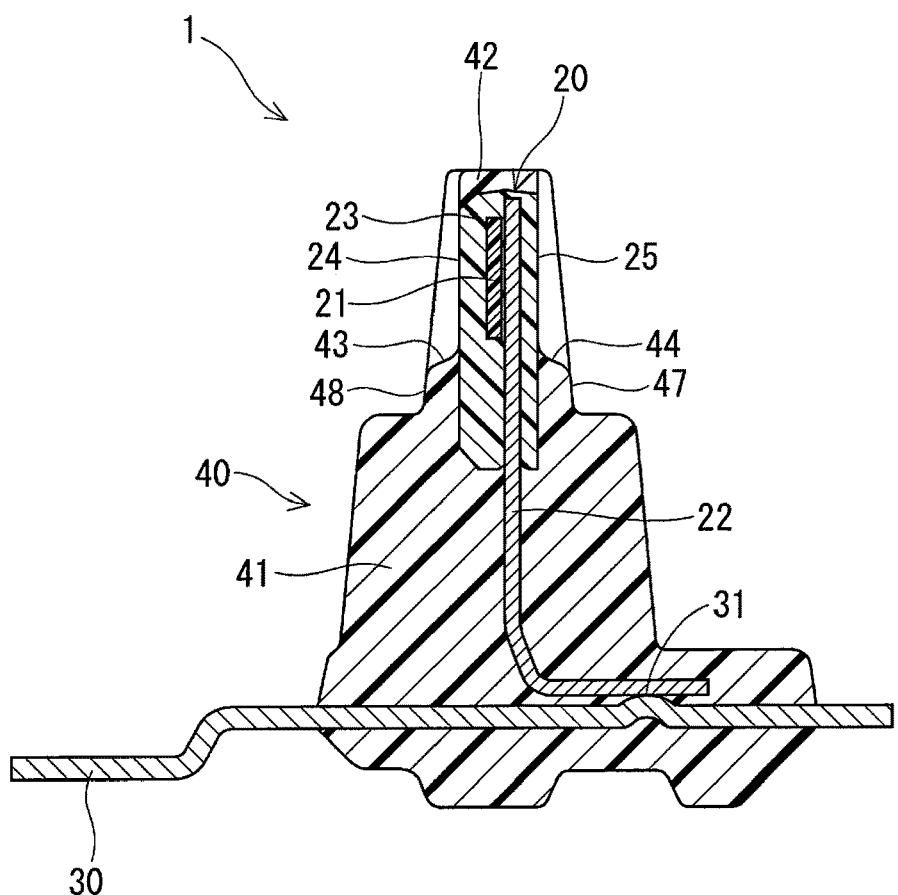
FIG. 5 is a cross-sectional diagram taken along V-V line of FIG. 3.

As shown in FIGS. 3 and 5, four lead frames 22 extend along a plane direction of the magnetism detection element 21. In the resin member 23, the four lead frames 22 and the magnetism detection element 21 are electrically connected with each other through a bonding wire that is not shown in the drawings.

The resin member 23 covers a part of the four lead frames 22, the magnetism detection element 21, and the bonding wire. The resin member 23 protects the magnetism detection element 21 from shock, heat, or moisture.

One end of each of the four lead frames 22 protrudes from the resin member 23. The parts of the four lead frames 22 protruding from the resin member 23 are bent to a direction perpendicular to the plane direction of the magnetism detection element 21.

The terminal 30 is approximately perpendicular to the plane direction of the magnetism detection element 21. All of the above-described four lead frames 22 are electrically and physically connected to the terminal 30 by welding, for example. In FIG. 5, a part in which the lead frame 22 and the terminal 30 are welded is indicated by a reference numeral 31.

The resin mold member 40 covers the IC package 20 and the terminal 30.

The resin mold member 40 integrally includes a base portion 41, a head portion 42, a detection side cutout portion 43, and a frame side cutout portion 44.

The base portion 41 has a trapezoid shape and molds the part in which the lead frame 22 and the terminal 30 are connected to each other. In detail, the base portion 41 covers the lead frame 22, a part of the terminal 30, and a part of the resin member 23 closer to the terminal 30 than the magnetism detection element 21 in the IC package 20. The base portion 41 protects the lead frame 22 and the welded part 31 in which the lead frame 22 and the terminal 30 are welded. A cross-section of the base portion 41 may be approximately trapezoid shape.

The head portion 42 protrudes from the base portion 41 toward a direction away from the terminal 30, and covers a part of the IC package 20 including the magnetism detection element 21. In detail, a cross-sectional area of the head portion 42 is smaller than that of the base portion 41, and covers a part of the resin member 23 including the magnetism detection element 21 of the IC package 20. The head portion 42 limits the position change of the IC package 20 and the terminal 30.

An outer wall surface of a thickest portion located on a magnetism detection element 21 side with respect to the lead frame 22 is referred to as "a detection side reference surface". The thickest portion is located in a base of the head portion 42. An outer wall surface of the thickest portion located on a lead frame 22 side with respect to the magnetism detection element 21 is referred to as "a frame side reference surface". In an outer wall surface of the IC package 20 constituted by the resin member 23, a part of the outer wall surface located in the magnetism detection element 21 side with respect to the lead frame 22 is referred to as "an element corresponding surface 24". A part of the outer wall surface of the IC package 20 located in the lead frame 22 side with respect to the magnetism detection element 21 is referred to as "a frame corresponding surface 25". The thickest portion may be a part in which the thickness from the IC package is the largest in the head portion. The thickest portion may be a part in which the thickness in a direction perpendicular to the plane direction of the magnetism detection element 21 is the largest in the head portion 42.

The resin mold member 40 of the first embodiment includes the detection side cutout portion 43 recessed from the detection side reference surface 48 of the IC package 20 toward the element corresponding surface 24. The resin mold member 40 includes the frame side cutout portion 44 recessed from the frame side reference surface 47 of the IC package 20 toward the frame corresponding surface 25.

The resin mold member 40 does not mold the element corresponding surface 24 and the frame corresponding surface 25 of the IC package 20. That is, the element corresponding surface 24 and the frame corresponding surface 25 of the IC package 20 are exposed to an outside of the resin mold member 40.

According to the above-described configurations, the magnetic field detection device 1 of the first embodiment has the following effects.

(1) In the first embodiment, since the resin mold member 40 includes the detection side cutout portion 43 and the frame side cutout portion 44, a stress, which is caused by a difference of linear expansions occurring when a temperature changes and exerted on the element corresponding surface 24 and the frame corresponding surface 25 of the IC package 20, can be limited. Accordingly, errors of the signal output from the first magnetism detection portion and the second magnetism detection portion provided in the magnetism detection element 21 can be limited. Consequently, the detection accuracy of the magnetic field detection device 1 can be improved.

In the first embodiment, the resin mold member 40 can be formed by injection molding in a condition where the element corresponding surface 24 and the frame corresponding surface 25 of the IC package 20 are in contact with an inner wall of a die into which the IC package 20 and the terminal 30 are inserted. According to this, since accuracy in positioning the IC package 20 can be improved, the detection accuracy of the magnetic field detection device 1 can be improved.

(2) In the first embodiment, the resin mold member 40 does not mold the element corresponding surface 24 of the IC package 20. That is, the element corresponding surface 24 is exposed to an outside of the resin mold member 40. Moreover, the thickness of the thickest portion of the head portion 42 including the detection side reference surface 48 is set such that the position change of the IC package 20 and the IC package 20 can be limited.

According to this, the magnetic field detection device 1 is capable of having both a configuration for reducing the stress caused by the difference of the linear expansions due to the temperature change and a configuration for limiting the position change of the IC package 20 and the terminal 30.

(3) In the first embodiment, the resin mold member 40 does not mold the frame corresponding surface 25 of the IC package 20. That is, the frame corresponding surface 25 is exposed to an outside of the resin mold member 40. Since the magnetic field detection device 1 has configurations that limit the stress caused by the difference of the linear expansions due to the temperature change, the errors of the signal output from the magnetism detection element 21 can be limited.

Moreover, the resin mold member 40 can be formed by injection molding in a condition where the frame corresponding surface 25 of the IC package 20 is in contact with the die. According to this, since accuracy in positioning the IC package 20 can be improved, the detection accuracy of the magnetic field detection device 1 can be improved.

(4) In the first embodiment, the magnetism detection element 21 includes the first magnetism detection portion and the second magnetism detection portion which output signals on a predetermined direction of the magnetic field, the phase angles of the signals being different from each other by 90 degrees.

According to this, arctangent operation is performed by using the signal output from the first magnetism detection portion as sine wave signal and using the signal output from the second magnetism detection portion as cosine wave signal, then a linear signal can be obtained. Consequently, the magnetic field detection device 1 is capable of accurately detecting the rotation angle of the throttle valve 3.

Second Embodiment

Figure 7:
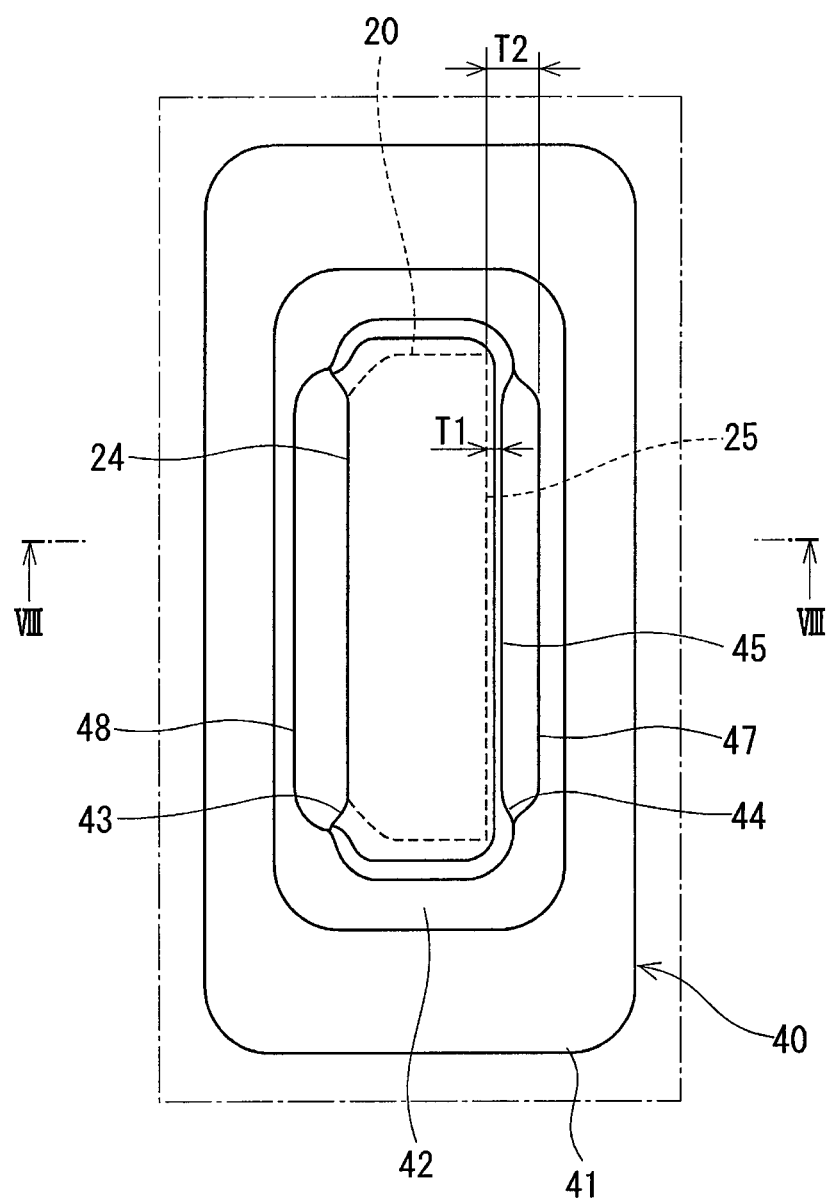
FIG. 7 is a plan view illustrating a magnetic field detection device according to a second embodiment of the present disclosure.
Figure 8:
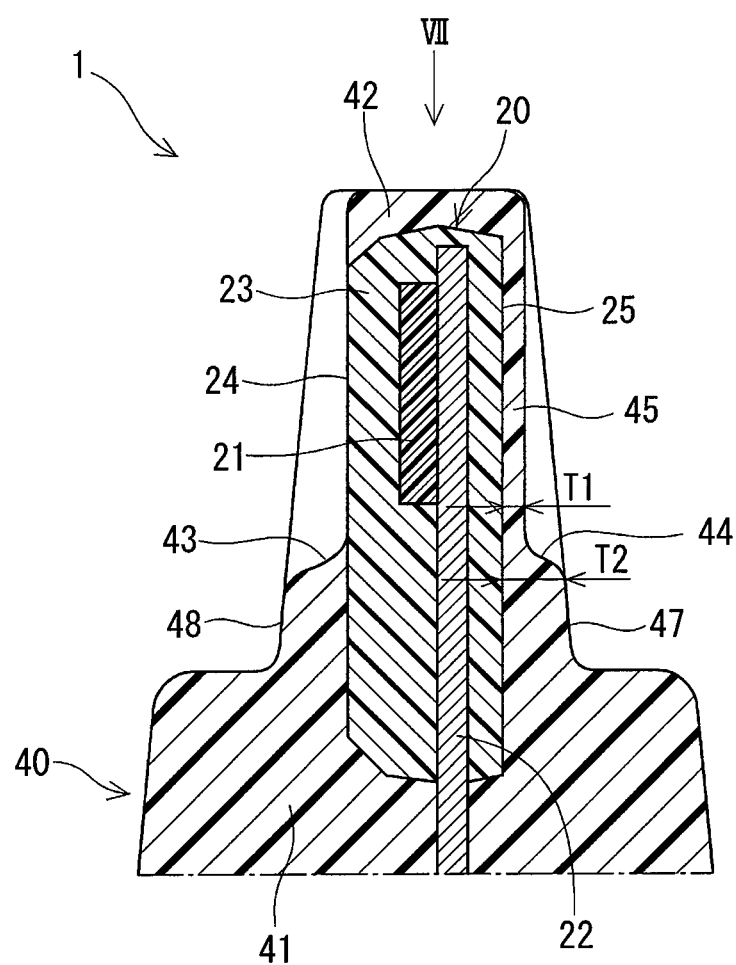
FIG. 8 is a cross-sectional diagram taken along VIII-VIII line of FIG. 7.

A second embodiment of the present disclosure is shown in FIGS. 7 and 8. In the second embodiment, the resin mold member 40 includes the detection side cutout portion 43, and the element corresponding surface 24 is exposed to an outside of the resin mold member 40, similarly to the first embodiment. In the second embodiment, the frame corresponding surface 25 of the IC package 20 is covered with a frame side thin portion 45 having a thickness T1. That is, the frame corresponding surface 25 is covered comparatively thinly. The thickness T1 is set such that the stress from the frame side thin portion 45 does not affect the output of the magnetism detection element 21.

According to this, since a stress caused by the difference of linear expansions due to the temperature change and exerted on the magnetism detection element 21 from the frame side thin portion 45 of the resin mold member 40 through the frame corresponding surface 25 of the IC package 20 is limited, accuracy of the output of the magnetism detection element 21 can be improved.

A thickness T2 is a thickness of a part outside the frame side thin portion 45 from the frame corresponding surface 25 of the IC package 20 to the frame side reference surface 47 of the head portion 42. T1 is smaller than T2. Since the thickness T2 from the frame corresponding surface 25 to the frame side reference surface 47 of the head portion 42 is large, the position change of the terminal 30 and the IC package 20 can be limited.

In the second embodiment, the resin mold member 40 can be formed by injection molding in a condition where an inner wall of a die for the resin mold member 40 is out of contact with the frame corresponding surface 25 of the IC package 20. According to this magnetic field detection device 1, a required precision of the die can be reduced.

Third Embodiment

Figure 9:
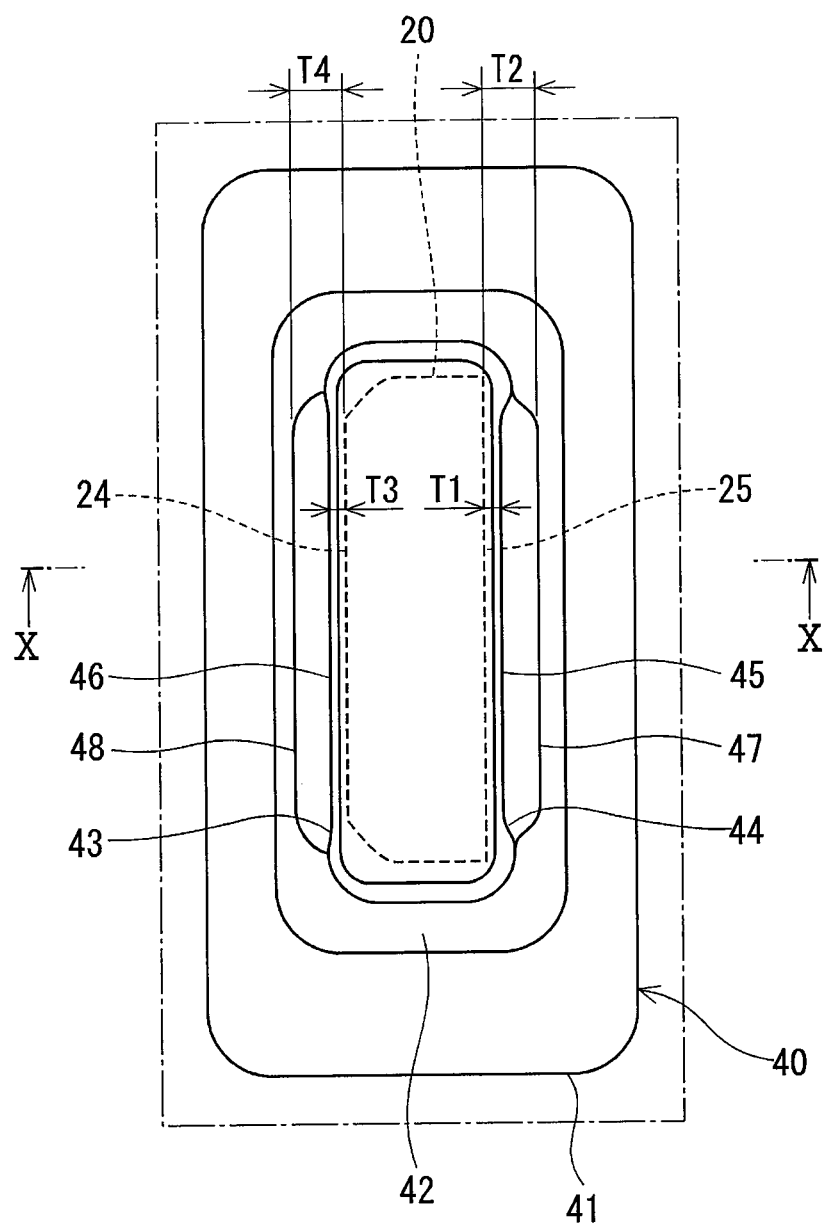
FIG. 9 is a plan view illustrating a magnetic field detection device according to a third embodiment of the present disclosure.
Figure 10:
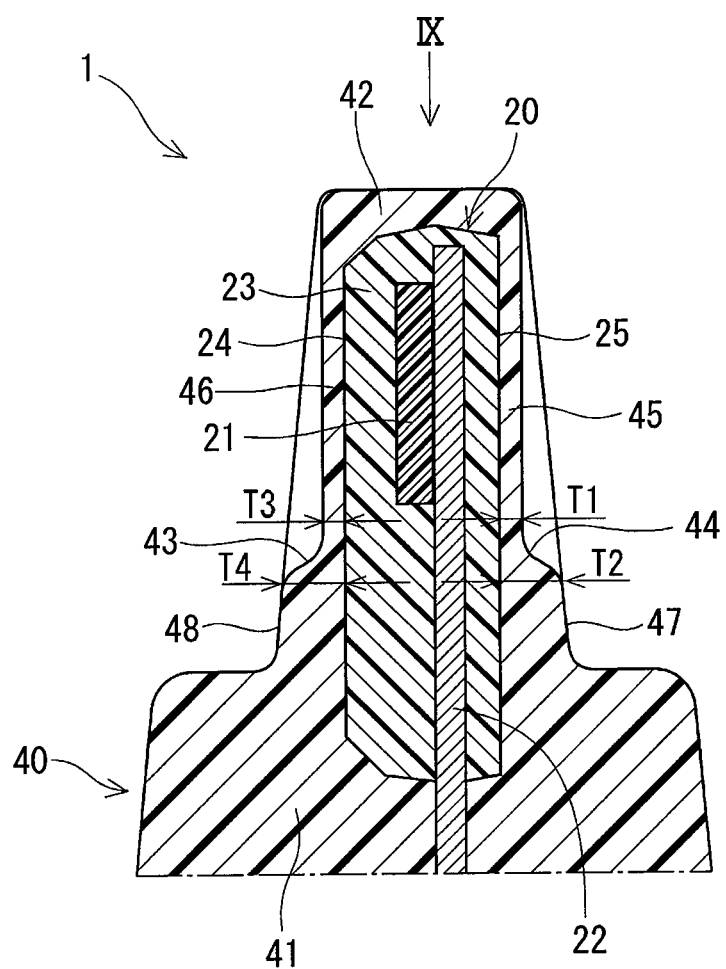
FIG. 10 is a cross-sectional diagram taken along X-X line of FIG. 9.

A third embodiment of the present disclosure is shown in FIGS. 9 and 10. The element corresponding surface 24 of the IC package 20 is covered with a detection side thin portion 46 having a thickness T3. That is, the element corresponding surface 24 is covered comparatively thinly. The thickness T3 is set such that a stress from the detection side thin portion 46 does not affect the output of the magnetism detection element 21.

According to this, since a stress caused by the difference of linear expansions due to the temperature change and exerted on the magnetism detection element 21 from the detection side thin portion 46 of the resin mold member 40 through the element corresponding surface 24 of the IC package 20 is limited, accuracy of the output of the magnetism detection element 21 can be improved.

A thickness T4 is a thickness of a part outside the detection side thin portion 46 from the element corresponding surface 24 of the IC package 20 to the detection side reference surface 48 of the head portion 42. T3 is smaller than T4. Since the thickness T4 from the element corresponding surface 24 to the detection side reference surface 48 of the head portion 42 is large, the position change of the terminal 30 and the IC package 20 can be limited.

In the third embodiment, the resin mold member 40 can be formed by injection molding in a condition where: an inner wall of a die for the resin mold member 40 is out of contact with the element corresponding surface 24 of the IC package 20; and the inner wall of the die is out of contact with the frame corresponding surface 25 of the IC package 20. According to this magnetic field detection device 1, a required precision of the die can be reduced.

Fourth Embodiment

Figure 11:
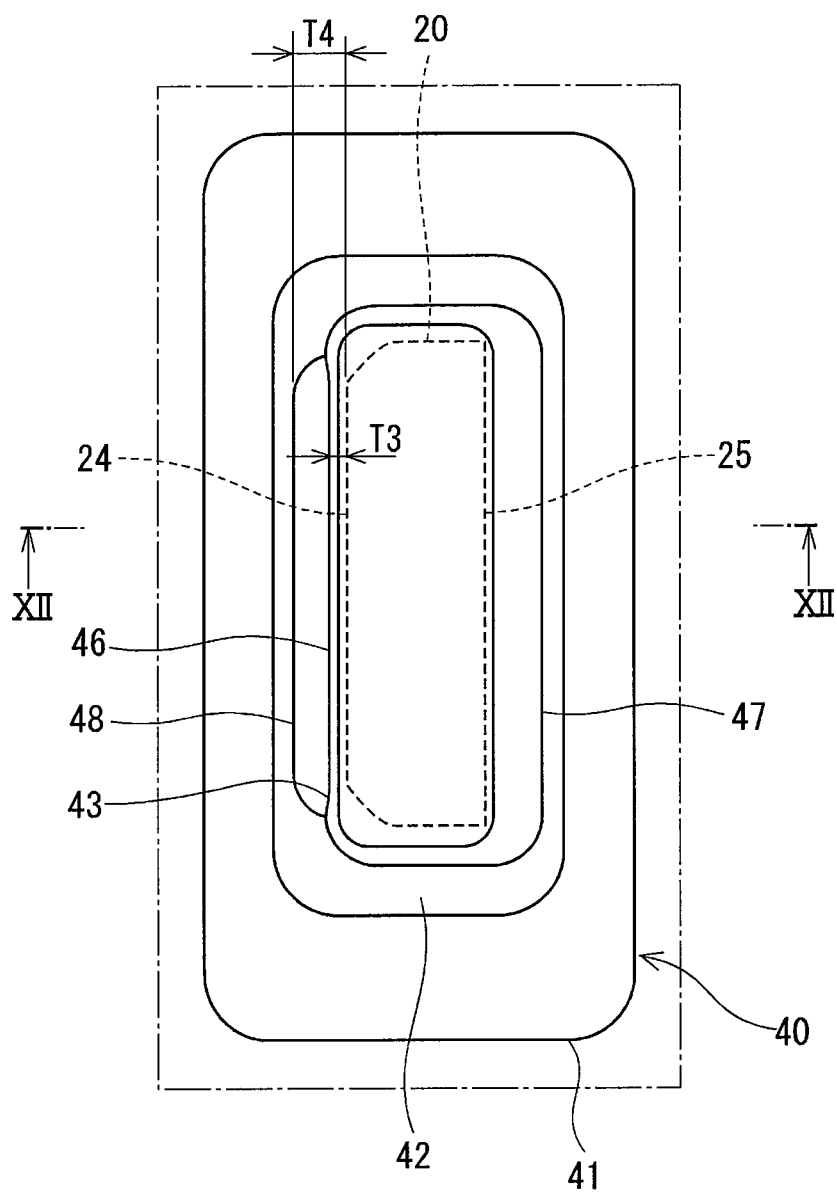
FIG. 11 is a plan view illustrating a magnetic field detection device according to a fourth embodiment of the present disclosure.
Figure 12:
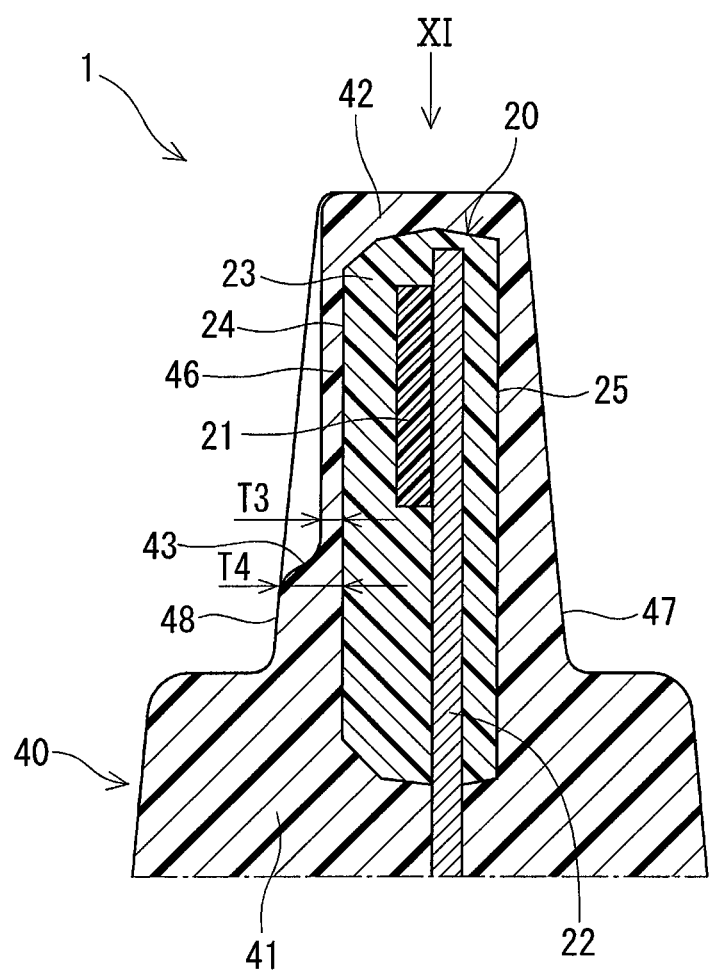
FIG. 12 is a cross-sectional diagram taken along XII-XII line of FIG. 11.

A fourth embodiment of the present disclosure is shown in FIGS. 11 and 12. In the fourth embodiment, an outer wall surface of a part of the head portion 42 of the resin mold member 40 which covers the frame corresponding surface 25 of the IC package 20 is a surface extending from the frame side reference surface 47. Accordingly, the frame corresponding surface 25 is covered relatively thickly, similarly to the thickest portion of the base of the head portion 42 in which the frame side reference surface 47 is defined.

In the fourth embodiment, the element corresponding surface 24 of the IC package 20 is covered with the detection side thin portion 46 having the thickness T3, similarly to the third embodiment. That is, the element corresponding surface 24 is covered comparatively thinly.

According to this, since a stress caused by the difference of linear expansions due to the temperature change and exerted on the magnetism detection element 21 from the detection side thin portion 46 of the resin mold member 40 through the element corresponding surface 24 of the IC package 20 is limited, accuracy of the output of the magnetism detection element 21 can be improved.

In the fourth embodiment, the resin mold member 40 can be formed by injection molding in a condition where: an inner wall of a die for the resin mold member 40 is out of contact with the element corresponding surface 24 of the IC package 20; and the inner wall of the die is out of contact with the frame corresponding surface 25 of the IC package 20. According to this magnetic field detection device 1, a required precision of the die can be reduced.

In the above-described embodiments, the magnetic field detection device 1 is described, which detects the rotation angle of the throttle valve 3 that is a detection target. However, the magnetic field detection device 1 may detect a position of a gas pedal or a crankshaft, for example.

The present disclosure is not limited to the above-described embodiments. The above-described embodiments may be combined and modified within the scope of the present disclosure.

Although the present disclosure has been fully described in connection with the preferred embodiments thereof, it is to be noted that various changes and modifications will become apparent to those skilled in the art. Moreover, other combinations and configurations, including more, less or only a single element, are also within the spirit and scope of the present disclosure.

The invention claimed is:

1. A magnetic field detection device comprising:
   an IC package that includes
      a magnetism detection element outputting a signal corresponding to a direction of a magnetic field,
      a lead frame located on a first side of the magnetism detection element in a thickness direction of the magnetism detection element, the lead frame being connected to the magnetism detection element, and
      a resin member covering the magnetism detection element and the lead frame;
   a terminal that is connected to a part of the lead frame of the IC package, the part of the lead frame protruding from the resin member; and
   a resin mold member that includes
      a base portion covering a connection part in which the lead frame is connected to the terminal, and
      a head portion protruding from the base portion in a direction away from the terminal and covering a part of the IC package, the part of the IC package including the magnetism detection element, wherein
   the resin mold member covers the IC package and a part of the terminal,
   the head portion includes a thickest portion in which a thickness in the thickness direction of the magnetism detection element from a surface of the IC package is largest in the head portion,
   an outer wall surface of the thickest portion located on a second side of the magnetism detection element opposite from the first side in the thickness direction is defined as a detection side reference surface,
   an element corresponding surface that is an outer wall surface of the IC package located on the second side is covered with a detection side thin portion of the resin mold member that has a thickness in the thickness direction smaller than a thickness in the thickness direction from the element corresponding surface to the detection side reference surface,
   an outer wall surface of the thickest portion of the head portion which is located on the first side is defined as a frame side reference surface,
   a frame corresponding surface of the IC package which is located on the first side is covered with a frame side thin portion of the resin mold member, that has a thickness smaller than a thickness from the frame corresponding surface to the frame side reference surface,
   the detection side thin portion and the frame side thin portion are integrally formed, and
   the magnetic field detection device further comprises a first magnetism detection portion and a second magnetism detection portion which output signals that are different in phase angle by 90 degrees from each other with respect to a predetermined direction of the magnetic field.

* * * * *